United States Patent [19]

Coules

[11] 3,996,500

[45] Dec. 7, 1976

[54] CHASSIS CONNECTOR AND CIRCUIT BOARD CLIP

[75] Inventor: Ronald A. Coules, Barrington, Ill.

[73] Assignee: Richco Plastic Company, Chicago, Ill.

[22] Filed: June 16, 1975

[21] Appl. No.: 586,870

[52] U.S. Cl. .......................... 317/101 CC; 24/73 P; 174/138 D; 174/164; 248/201; 248/223; 248/316 D; 248/500; 339/125 R
[51] Int. Cl.² ...................... H05K 7/12; F16B 2/20; F16B 5/06
[58] Field of Search ....... 174/138 D, 138 G, 158 R, 174/164, 138, 158; 317/101 R, 101 CC, 101 CM, 101 D, 101 DH, 101; 339/91 R, 125 R, 128, 125; 24/73 R, 73 D, 73 P, 73 PF, 73 PM, 73; 85/5 R; 248/24, 73, 74 A, 201, 223–225, 229, 309 A, 316 D, 488, 500, 507, 510

[56] References Cited

UNITED STATES PATENTS

| | | | |
|---|---|---|---|
| 3,001,748 | 9/1961 | Austin | 248/488 X |
| 3,274,450 | 9/1966 | Siebold | 174/158 R X |
| 3,530,426 | 9/1970 | Snyder, Jr. | 339/128 |
| 3,811,154 | 5/1974 | Lindeman et al. | 317/101 CC X |
| 3,874,766 | 4/1975 | Mizusawa | 339/125 R |

FOREIGN PATENTS OR APPLICATIONS

| | | | |
|---|---|---|---|
| 2,001,074 | 7/1971 | Germany | 248/223 |
| 1,061,664 | 3/1967 | United Kingdom | 317/101 CC |

*Primary Examiner*—Laramie E. Askin

[57] ABSTRACT

A chassis connector and circuit board clip for electronic equipment, said clip having a pair of upright spaced apart legs, each having anchor means for mounting in a slotted chassis, a wall bridging the legs for supporting a circuit board spaced apart from and in alignment with a connector, and a locking tooth carried by one of the legs for holding the edge of an aligned circuit board relative to the chassis and connector. The clip is molded in one piece from plastic dielectric insulating material and one modification thereof also includes means for securing the connector to the chassis.

9 Claims, 6 Drawing Figures

CHASSIS CONNECTOR AND CIRCUIT BOARD CLIP

BACKGROUND OF THE INVENTION

This invention relates to a clip for electronic equipment, and is more particularly concerned with a clip of the character described which may be molded from plastic dielectric insulating material and which has means for positioning and supporting a connector and circuit board spaced apart from the chassis.

In order to insure electric contact of a power source to electronic equipment, a connector must be positioned and remain in contacting alignment with the electronic circuit in the equipment. While maintaining the desired contact, it is also important that the circuit be held spaced apart from the chassis and from unintended shorting between the connector, circuit and chassis. Furthermore, for ease of service in the installation and removal of circuit boards, it is preferred that the circuit board be installed and changed without disassembling the connector.

A clip embodying the present invention has a pair of upright spaced apart legs, each having anchor means for engagement in a slot formed in the chassis to removably secure the clip upstanding on the chassis. Bridging the upright legs is a wall for supporting a circuit board thereon, and which, with the legs, forms a channel for aligning the connector relative to the circuit board; and a flexible locking tooth extends from one of the legs for releasably securing the circuit board aligned with the connector and spaced apart from the chassis.

With one typical connector device, known as the "AMP connector", the connector is conventionally secured in a slot formed in the chassis. Diametrically opposed slots are formed in the chassis adjacent the connector slot, and clip anchor means are secured in each of the opposed slots. Another type of connector may be secured in inwardly extending opposed ribs provided on each of the clip legs, and the invention includes this modified clip having connector engaging ribs.

It is the object of the present invention to provide a novel connector and circuit board support clip of the character referred to.

Another object is to provide a novel clip adapted to position and secure a circuit board and connector in alignment with one another on a chassis.

Another object is to provide a connector and circuit board support clip having a flexible releasable locking member for removably securing a circuit board aligned with a connector and spaced apart from a chassis.

Another object is to provide a novel circuit board and connector clip having means to secure a connector on a chassis.

Another object is to provide a clip of the character referred to which may be easily and inexpensively molded from plastic dielectric insulating material and which may be efficiently used to install a connector and circuit board aligned on and spaced apart from a chassis without special installation tools, skills or other handware or fasteners.

Another object is to provide a connector and circuit board clip having a releasable circuit board locking member for installing, removing and re-installing a circuit board without affecting the mounting of the connector on the chassis.

Other objects and advantages of the invention will become apparent as this description proceeds, taken in conjunction with the accompanying drawings.

DESCRIPTION OF THE PREFERRED EMBODIMENT

Figure 1:
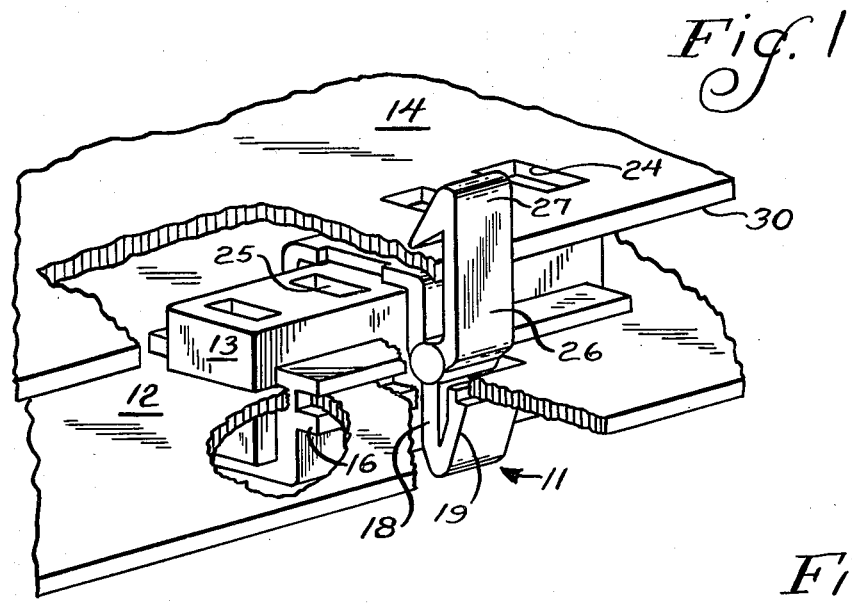
FIG. 1 is a perspective view of a clip embodying the invention, securing an aligned connector and circuit board on a chassis, with portions of associated devices broken away and in section.
Figure 3:
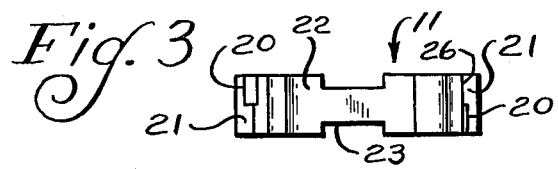
FIG. 3 is a top plan view of the clip shown in FIG. 2.
Figure 2:
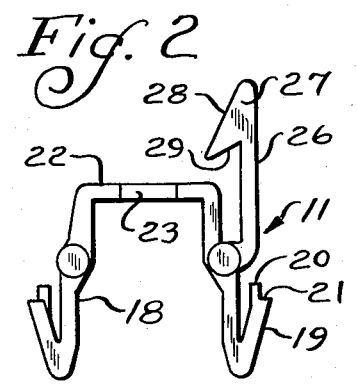
FIG. 2 is a side elevational view of the novel clip shown in FIG. 1.
Figure 4:
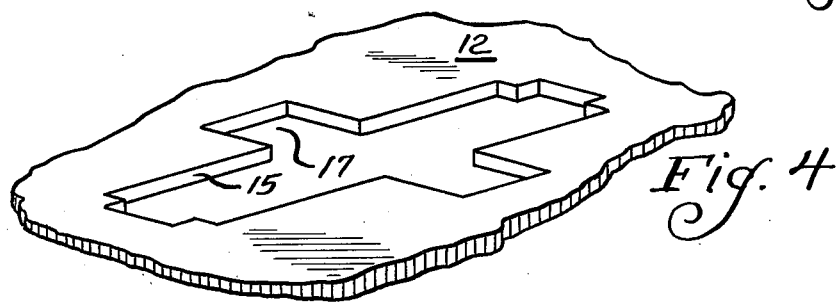
FIG. 4 is a perspective view showing the connector and clip mounting slots formed in the chassis.

With reference to the clip shown in FIGS. 1 – 4, a clip 11 embodying the invention is mounted on a chassis 12 and secures a connector 13 in alignment with a circuit board 14.

A substantially rectangular slot 15 is formed in the chassis and the connector has a longitudinally extending channel member 16 for securing the connector 13 in the chassis 12. Diametrically opposed slots 17 are formed on each side of the connector slot 15, and the clip 11 is secured upstanding therein, as hereinafter more particularly described.

The clip 11 has upstanding spaced apart legs 18, and a wing 19 on the end of each leg extending outwardly and upwardly, there being an extension 20 and shoulder 21 on the free end of each wing. The wings and legs are flexible and may be snap engaged in the slots 17, with the shoulders bearing on the underside of the chassis 12 and extensions bearing on the sides of the slots 17, to anchor the clip upright on the chassis. Bridging the legs 18 is a horizontally disposed wall 22, a portion 23 of which is narrowed, to permit the connecting pin or prong to pass on either or both sides thereof.

Seated on the wall 22 of the clip 11 is the circuit board 14, the circuit board having suitable apertures 24 aligned with slots 25 formed in the connector 13.

Extending from one of the clip legs 18 is a circuit board locking member comprised of a flexible arm 26 and a locking barb 27 on the upper end thereof. The barb 27 is formed with an inclined wall 28 tapered toward its tip and a lower inclined side 29 extending toward its arm 26, and this barb extends a sufficient distance so that its walls lie above the plane of the bridging wall 22.

In the use of this embodiment, after the connector is conventionally attached to the chassis 12, the clip 11 is snap engaged in the opposed slots 17, and the legs 18 are held spread apart by the connector 13. After the connector slots 25 and the circuit board slots 24 are aligned with one another and the narrowed portion of the bridging wall 22, the circuit board 14 is pressed downwardly, thus camming the flexible arm 26 outwardly by engagement of the circuit board edge 30 against the inclined wall 28 of the barb 27, until the circuit board clears the barb, whereupon the arm 26 returns to its normal position, with the lower inclined side 29 of the barb bearing upon the circuit board, thereby locking the board in position. If the alignment of the circuit board and connector slots is imperfect, the board 14 can be slid slightly from side to side until the slot alignment is perfected.

Figure 5:
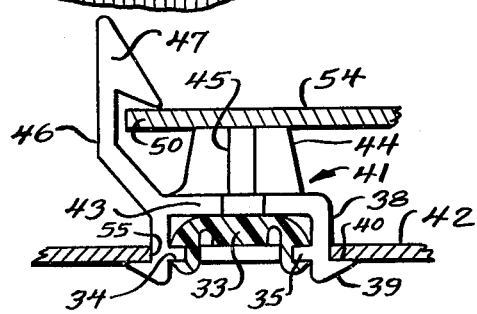
FIG. 5 is an elevational view of a mounted modified clip, showing the connector and circuit board in section.
Figure 6:
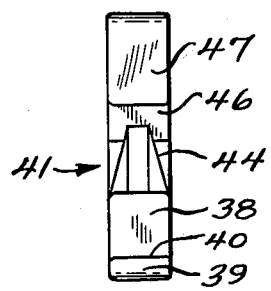
FIG. 6 is a side elevational view of the modified clip taken at right angles to the clip shown in FIG. 5.

In the embodiment shown in FIGS. 5 and 6, the connector 33 has grooves 34 which engage inwardly extending ribs 35 on each of the spaced apart legs 38 of the clip 41. In this embodiment, the wings 39 are relatively short and the shoulders 40 engage the underside of the chassis 42. The bridging wall 43 has a thickened body 44, with pin or prong engaging apertures 45 formed therethrough. The flexible arm 46 extends outwardly and upwardly from one of the legs 38 and has a barb 47 on the free end thereof, which is adapted to spring engage the edge 50 of a circuit board 54 seated on the body 44. As shown in FIG. 5, the connector is preferably snapped into engagement with the clip ribs 35 before the legs 38 are snapped into the slot 55 provided in the chassis 42, and the circuit board 54 is secured on the clip 41 in a manner substantially identical to the mounting and locking described in connection with the clip 11 shown in FIGS. 1 – 4.

While the clips embodying the invention provide a preferred mounting for a circuit board relative to the connector and chassis, such clips can be used to mount other components in electronic or electrical equipment where it is desired to secure one element spaced apart from and in alignment with another element.

Preferably, the circuit board or component is supported at more than a single point, either by multiple clips of the character referred to, or by other types of spacer supports, with the clip embodying the invention being employed to support the circuit board relative to its connector.

While preferred embodiments of the invention have been shown and described, it is desired that the invention not be limited to the exact construction disclosed, as many changes or modifications can be made in the devices shown without departing from the spirit or scope of the invention.

I claim:

1. A one piece clip of plastic dielectric insulating material for supporting an electrical component on and spaced apart from an apertured chassis in alignment with an electrical connector for said component mounted on the chassis, said clip comprising a pair of spaced apart legs, each of said legs having barbed anchor means adapted to snap engage in said chassis aperture for holding said clip upstanding on the chassis, a wall bridging said legs adapted to support said component thereover, said legs and wall defining a channel for positioning said connector and component in registering alignment with one another for electrical connection between them, a portion of said bridging wall being cut out to permit electrical connection between said component and said connector, and means on said clip to releasably lock said component in aligned position with the connector without disturbing the mounting of the connector on the chassis.

2. The clip recited in claim 1, wherein said legs have means for securing said connector therebetween.

3. The clip recited in claim 2, wherein said connector securing means comprises inwardly extending ribs adapted to engage said connector.

4. The clip recited in claim 1, wherein said releasable lock means has an upstanding flexible arm substantially parallel to each of said legs, one end of said arm being connected to one of said legs intermediate said bridging wall and said anchor means, said arm being adapted for movement toward and away from said bridging wall.

5. The clip recited in claim 4, wherein said arm has a portion extending from said one leg in a plane transverse to the plane of the bridging wall which is adapted for flexing free of said chassis.

6. The clip recited in claim 1, wherein said legs are spaced apart a distance greater than the width of said supporting wall.

7. The clip recited in claim 1, wherein said legs are spaced apart adjacent said bridging wall a distance less than said legs are spaced apart adjacent said anchor means.

8. An apertured chassis and clip system for removably securing an electrical component on and spaced apart from said chassis in alignment with an elongated electrical connector, said clip comprising spaced apart upstanding legs and a wall bridging said legs, said legs each having anchor means snap engaged in the chassis, and lock means for releasably securing the component on the bridging wall aligned for electrical connection with the connector, said legs being adapted to position the connector therebetween in register with the component; and said chassis comprising a panel, an elongated slot in the panel adapted to fit said connector therethrough, and an enlarged aperture in the panel on each side and perpendicular to the longitudinal axis of the slot securing the clip anchor means in the chassis.

9. The system recited in claim 8, wherein the clip legs have inwardly extending ribs adapted to hold the connector aligned with and spaced apart from the bridging wall.

* * * * *